(12) United States Patent
Murji (10) Patent No.: US 8,909,180 B1
(45) Date of Patent: Dec. 9, 2014

(54) METHOD AND APPARATUS FOR POWER SUPPLY MODULATION OF A RADIO FREQUENCY SIGNAL

(71) Applicant: Motorola Solutions, Inc, Schaumburg, IL (US)

(72) Inventor: Rizwan Murji, Hoffman Estates, IL (US)

(73) Assignee: Motorola Solutions, Inc., Schaumburg, IL (US)

( * ) Notice: Subject to any disclaimer, the term of this patent is extended or adjusted under 35 U.S.C. 154(b) by 0 days.

(21) Appl. No.: 13/927,696

(22) Filed: Jun. 26, 2013

(51) Int. Cl.
*H01Q 11/12* (2006.01)
*H04B 1/04* (2006.01)
*H04L 27/04* (2006.01)

(52) U.S. Cl.
CPC ..................... *H04L 27/04* (2013.01)
USPC ............. 455/127.1; 455/115.1; 455/561; 330/127; 330/297

(58) Field of Classification Search
CPC ............ H03F 2200/102; H03F 2200/324; H03F 2200/451; H03F 2200/504; H03F 3/24; H03F 3/289; H03F 1/0211; H03F 1/025; H03F 1/0266; H04B 17/01; H04B 1/1607; H04B 2001/0441; H04B 2001/0408; H04B 2001/045; H03G 3/004; H03G 1/00; H03G 1/00005; H03G 1/04
USPC ............ 455/63.1, 67.11, 67.13, 115.1, 127.1, 455/561; 330/127, 129, 149, 297; 375/295, 375/300
See application file for complete search history.

(56) References Cited

U.S. PATENT DOCUMENTS

| | | | |
|---|---|---|---|
| 5,420,536 A * | 5/1995 | Faulkner et al. | 330/149 |
| 6,138,042 A | 10/2000 | Midya et al. | |
| 6,141,541 A | 10/2000 | Midya et al. | |
| 6,353,359 B1 | 3/2002 | Leizerovich | |
| 6,449,465 B1 | 9/2002 | Gailus et al. | |
| 6,606,483 B1 | 8/2003 | Baker et al. | |
| 6,624,711 B1 | 9/2003 | Khan et al. | |
| 6,725,021 B1 | 4/2004 | Anderson et al. | |
| 6,735,419 B2 | 5/2004 | Mitzlaff | |
| 7,135,918 B1 * | 11/2006 | Outaleb et al. | 330/136 |
| 7,164,893 B2 | 1/2007 | Leizerovich et al. | |
| 7,453,927 B2 | 11/2008 | Vepsalainen et al. | |
| 7,482,869 B2 | 1/2009 | Wilson | |
| 7,933,569 B2 * | 4/2011 | Suzuki et al. | 455/115.1 |
| 8,417,199 B2 | 4/2013 | Murji | |
| 8,447,245 B2 * | 5/2013 | Staudinger et al. | 455/127.1 |
| 8,737,940 B1 * | 5/2014 | Langer et al. | 455/127.1 |
| 2004/0127173 A1 | 7/2004 | Leizerovich | |

(Continued)

*Primary Examiner* — Quochien B Vuong
(74) *Attorney, Agent, or Firm* — Daniel R. Bestor; Steven A. May (57) ABSTRACT

A transmitter power supply modulates an RF signal without needing to run a calibration/training cycle every time an exciter or PA module is switched in and out or every time the transmitter powers up. During calibration of the exciter module, an exciter module delay factor is determined, and stored in the exciter module, for each signal modulation scheme that may be implemented by the exciter module. During calibration of a power amplifier (PA) module, a power supply modulation (PSM) delay factor is determined for, and stored in, the PA module. During transmitter operation, the exciter module generates RF and envelope signals based on an input signal. The PA module generates a power supply voltage based on the envelope signal and a final delay factor, which final delay factor is based on the exciter module and PSM delay factors. The PA module then modulates the RF signal using the power supply voltage.

20 Claims, 8 Drawing Sheets

(56) References Cited

U.S. PATENT DOCUMENTS

| | | |
|---|---|---|
| 2007/0178856 A1 | 8/2007 | Mitzlaff et al. |
| 2010/0001793 A1 | 1/2010 | Van Zeijl et al. |
| 2012/0019320 A1 | 1/2012 | Cummins |
| 2012/0088510 A1 | 4/2012 | Akhi et al. |
| 2012/0154039 A1 | 6/2012 | Brice |
| 2012/0200354 A1 | 8/2012 | Ripley et al. |
| 2012/0229208 A1 | 9/2012 | Wimpenny et al. |
| 2012/0235741 A1 | 9/2012 | Brice |
| 2012/0249238 A1 | 10/2012 | Bartram |
| 2013/0076418 A1 | 3/2013 | Belitzer et al. |

* cited by examiner

FIG. 7B

METHOD AND APPARATUS FOR POWER SUPPLY MODULATION OF A RADIO FREQUENCY SIGNAL

FIELD OF THE INVENTION

The present invention relates generally to wireless communication devices, and in particular to a transmitter portion of a wireless communication device that employs power supply modulation of a radio frequency signal.

BACKGROUND OF THE INVENTION

With the ever-increasing demand for portable communication devices, reliability and efficiency of both user devices and devices in the supporting network has become of increasing importance. There are a number of different considerations, related to both individual elements as well as system elements, which affect these characteristics. For example, it is desirable to increase both bandwidth efficiency and power efficiency of a power amplifier in various communication devices. While bandwidth efficiency (the rate that data can be transmitted over a given bandwidth) is typically achieved using linear modulation, amplifier efficiency is a significant concern for achieving longer battery life and lower energy costs in transmitters as it usually dominates the power consumption in the system.

A transmitter of the portable communication device or of a communication device in the infrastructure (such as a base station) generally uses a radio frequency power amplifier (RFPA) as the final amplifying stage of a transmitter. The RFPA typically has a fixed power supply voltage. With a fixed supply voltage, however, the efficiency of the RFPA decreases as the output signal magnitude drops, leading to ineffectiveness and excessive peak power capability. To improve efficiency, it is desirable for the RFPA to continually operate near saturation, where the amplifier is close to or slightly gain compressed (about 0.5 dB below gain compression to 0.5 dB in gain compression). This can be achieved by modulating the power supply of the RFPA using the known technique of envelope tracking (that is, the supply voltage of the RFPA tracks the output signal of the RFPA), which adjusts the power supply of the RFPA such that the power supply voltage of the RFPA follows the output signal thereby allowing the RFPA to continually operate near saturation.

To prevent starvation of the RFPA, some margin is designed into the implementation. However, adding margin to the supply voltage of the RFPA is less than ideal because it reduces average efficiency. At the same time, not having the margin will often cause distortion in the amplified signal generated by the RFPA because of unexpected gain compression. In addition, for an adaptive design, the RFPA is often designed to handle several different signal modulation schemes. Therefore, it is also required that today's efficiency improvement methods be able operate for any given modulation. Correspondingly, amplitude accuracy of a reference envelope of the modulation and time alignment of the envelope signal provided to the RFPA are very important.

In a practical application, an amplitude and/or phase of an I/Q path is modified to improve overall transmitter performance, causing the overall amplitude of the envelope signal ($I^2+Q^2$) to be distorted from a received input signal that is to be transmitted. The envelope signal can be single ended or differential in nature. Such modifications may include DC offset calibration, phase calibration and IQ balance calibration. In addition to these changes, in a dynamic system that is capable of operation over a wide output power range, the amplitude of the I/Q path out of a DSP often is adjusted in order to provide the full output dynamic range. In a supply modulated system, the envelope of the signal to be transmitted is the reference that ultimately sets the minimum and maximum voltage levels of the modulation to the RFPA.

In addition to amplitude calibration, time alignment of the envelope signal to the transmitted RF signal is critical in supply modulated systems for high efficiency. In a practical application, the delay in the I/Q path is added by filters required for signal conditioning, such as low pass and switch capacitor filtering. In addition, the switch capacitor filters often are programmable to allow adjustments for a particular modulation or bandwidth. Therefore, in practice, the programmable delay must be matched in both the envelope and I/Q paths. However, adding an additional fixed hardware delay many not always be possible due to space limitations, additional cost for the hardware delay elements and once designed, it is often very difficult to add additional delay in either path if required.

Therefore, a need exists for an improved reference accuracy scheme comprising of both amplitude and time alignment of the envelope and RF signals. In addition, the improved reference accuracy scheme should provide a simple means for mass production and that is programmable to allow time alignment independent of the amount of fixed delay in the I/Q path in a supply modulated system.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

One of ordinary skill in the art will appreciate that elements in the figures are illustrated for simplicity and clarity and have not necessarily been drawn to scale. For example, the dimensions of some of the elements in the figures may be exaggerated relative to other elements to help improve understanding of various embodiments of the present invention. Also, common and well-understood elements that are useful or necessary in a commercially feasible embodiment are often not depicted in order to facilitate a less obstructed view of these various embodiments of the present invention.

DETAILED DESCRIPTION OF THE INVENTION

To address the need for a method and apparatus for an improved reference accuracy scheme comprising of both amplitude and time alignment of envelope and radio frequency (RF) signals in a wireless transmitter and that provides a simple means for mass production and is programmable to allow time alignment independent of the amount of fixed delay in the I/Q path in a supply modulated system, a method, transmitter, and wireless communication device are provided that power supply modulate an RF signal for transmission over the air, and do so without the need to run a new calibration and training cycle every time an exciter or PA module is switched in and out of a transmitter or every time the transmitter powers up. During calibration of one or more exciter modules associated with the transmitter, an exciter module delay factor is determined for each signal modulation or bandwidth scheme that may be implemented by the one or more exciter modules, with exciter module delay factors stored in the one or more exciter modules. Further, during calibration of a power amplifier module of the transmitter, a power supply modulation delay factor is determined and stored in the power amplifier module. During operation of the transmitter, an exciter module of the one or more exciter modules generates an RF signal and an envelope signal based on an input signal, and the power amplifier module generates a power supply voltage based on the envelope signal and a final delay factor that is, in turn, determined based on an exciter module delay factor and the power supply modulation delay factor. The power amplifier module then modulates the RF signal based on the power supply voltage.

Generally, the present invention encompasses a method for modulating a radio frequency signal. The method includes determining an exciter module delay factor based on a signal modulation scheme, wherein the exciter module delay factor corresponds to a propagation time difference between an envelope signal path of an exciter module and an RF signal path of the exciter module; determining a power supply modulation delay factor, wherein the power supply modulation delay factor corresponds to a time delay between an application of an envelope signal to a power supply modulation circuit and a generation of a power supply voltage based on the envelope signal; and determining a final delay factor based on the exciter module delay factor and the power supply modulation delay factor. The method further includes generating a radio frequency signal based on an input signal; generating an envelope signal based on the input signal; generating a power supply voltage based on the envelope signal and the final delay factor; and modulating the radio frequency signal based on the power supply voltage.

Another embodiment of the present invention encompasses a power supply modulation transmitter. The transmitter includes an exciter module that is configured to determine an exciter module delay factor based on a signal modulation scheme, wherein the exciter module delay factor corresponds to a propagation time difference between an envelope signal path of the exciter module and an RF signal path of the exciter module. The transmitter further includes a power amplifier module that is coupled to the exciter module and that is configured to determine a power supply modulation delay factor, wherein the power supply modulation delay factor corresponds to a time delay between an application of an envelope signal to the power amplifier module and a generation of a power supply voltage based on the envelope signal, and determine a final delay factor based on the exciter module delay factor and the power supply modulation delay factor. The exciter module further is configured to generate a radio frequency signal based on an input signal and generate an envelope signal based on the input signal, and the power amplifier module further is configured to receive the radio frequency signal and the envelope signal from the exciter module, generate a power supply voltage based on the envelope signal and the final delay factor, and modulate the radio frequency signal based on the power supply voltage.

Yet another embodiment of the present invention encompasses a wireless communication device an information source that sources information to a transmitter and a transmitter that is configured to receive the information from the information source and produce an input signal based on the received information. The transmitter further is configured to determine an exciter module delay factor based on a signal modulation scheme, wherein the exciter module delay factor corresponds to a propagation time difference between an envelope signal path of an exciter module and an RF signal path of the exciter module; determine a power supply modulation delay factor, wherein the power supply modulation delay factor corresponds to a time delay between an application of an envelope signal to a power supply modulation circuit and a generation of a power supply voltage based on the envelope signal; and determine a final delay factor based on the exciter module delay factor and the power supply modulation delay factor. The transmitter further is configured to generate a radio frequency signal based on the input signal; generate an envelope signal based on the input signal; generate a power supply voltage based on the envelope signal and the final delay factor; modulate the radio frequency signal based on the power supply voltage to produce an output signal; and wirelessly transmit the output signal.

Figure 1:
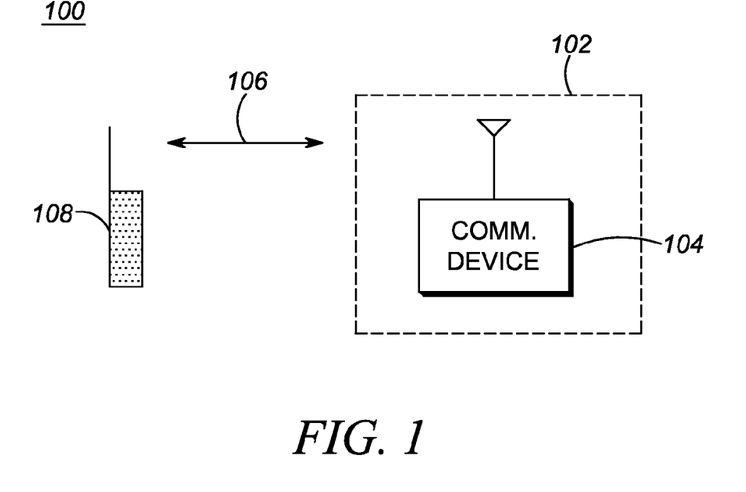
FIG. 1 is a block diagram of a communication system in accordance with an embodiment of the present invention.

The present invention may be more fully described with reference to FIGS. 1-7B. FIG. 1 illustrates a wireless communication system 100 in accordance with an embodiment of the present invention. Communication system 100 comprises a radio access network 102 that includes a wireless communication device 104, such as a base station, a Node B, an eNodeB, an Access Point, or any other infrastructure wireless communication device known in the art that provides wireless communication services to portable communication devices, such as portable communication device 108, disposed within a coverage area serviced by the access node via an air interface 106. Portable communication device 108 can be, for example, a cellular telephone, a radio telephone, a laptop computer, tablet computer, or personal digital assistant with wireless communications capabilities, or a communication device used by emergency personnel. Air interface 106 includes a downlink, or forward link, (not shown) for communicating information from access node 104 to portable communication device 108 and an uplink, or reverse link, (not shown) for communicating information from portable communication device 108 to access node 104.

Figure 2:
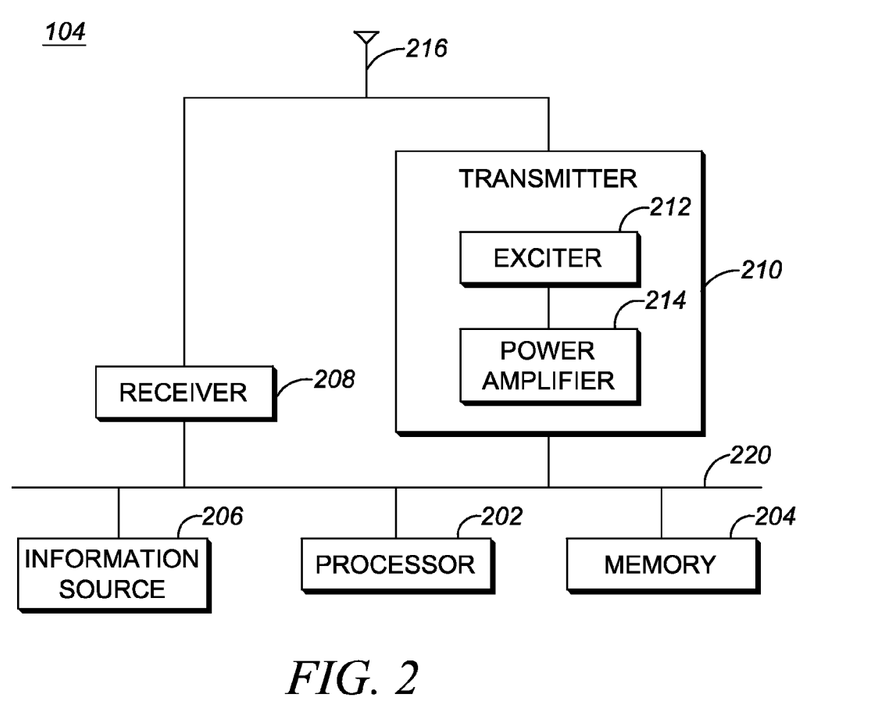
FIG. 2 is a block diagram of a communication device of FIG. 1 in accordance with an embodiment of the present invention.

FIG. 2 is a block diagram of wireless communication device 104 in accordance with an embodiment of the present invention. Preferably, wireless communication device 104 is an access node; however, wireless communication device 104 may be any communication device capable of wirelessly transmitting information, such as a cellular telephone, a radiotelephone, or a wireless modem. Communication device 104 may contain, among other components, a processor 202, one or more memory devices 204, an information source 206, and a receiver 208 and a transmitter 210 that are each coupled to an antenna 216. Communication device 104 is preferably an integrated unit and may contain at least all the elements depicted in FIG. 2 as well as any other element necessary for the communication device to perform its electronic functions. The electronic elements are connected by a bus 220.

Processor 202 includes one or more microprocessors, microcontrollers, DSPs, state machines, logic circuitry, or any other device or devices that process information based on operational or programming instructions. Such operational or programming instructions are stored in the at least one memory device 204 and may include instructions such as estimation and correction of a received signal, encryption/decryption, and decisions about whether an alarm exists that are executed by the processor 202 as well as information related to the transmit signal such as modulation, transmission frequency or signal amplitude. At least one memory device 204 may be an IC memory chip containing any form of random access memory (RAM) and/or read only memory (ROM), a floppy disk, a compact disk (CD) ROM, a hard disk drive, a digital video disk (DVD), a flash memory card, a non-volatile memory, or any other medium for storing digital information. One of ordinary skill in the art will recognize that when the processor 202 has one or more of its functions performed by a state machine or logic circuitry, at least one memory device 204 containing the corresponding operational instructions may be embedded within the state machine or logic circuitry.

Receiver 208 and transmitter 210 enable communication device 104 to respectively receive and transmit radio frequency (RF) communication signals. In this regard, the receiver 208 and transmitter 210 include appropriate circuitry to enable wireless transmissions. The implementations of the receiver 208 and transmitter 210 depend on the implementation of communication device 104 and the devices with which it is to communicate. For example, receiver 208 and transmitter 210 may be implemented as part of the communication device hardware and software architecture in accordance with known techniques. One of ordinary skill in the art will recognize that most, if not all, of the functions of the receiver 208 and transmitter 210 may be implemented in a processor, such as the processor 202. However, processor 202, receiver 208, and transmitter 210 have been artificially partitioned herein to facilitate a better understanding.

Information source 206 can include an interface with devices or networks external to communication device 104, or in other embodiments, for example, in the case of a cellular telephone or a radiotelephone, may be a user interface or an application running on processor 202. For example, communication device 104 may include a variety of input/output (I/O) devices (not shown) whereby a user may input instructions and information into the communication device, such as a keyboard, a touch screen, a microphone, and a speaker. Again, although communication device 104 discussed with relation to the figures may be referred to as an access node, other communication devices that employ a power amplifier may be used.

Figure 3:
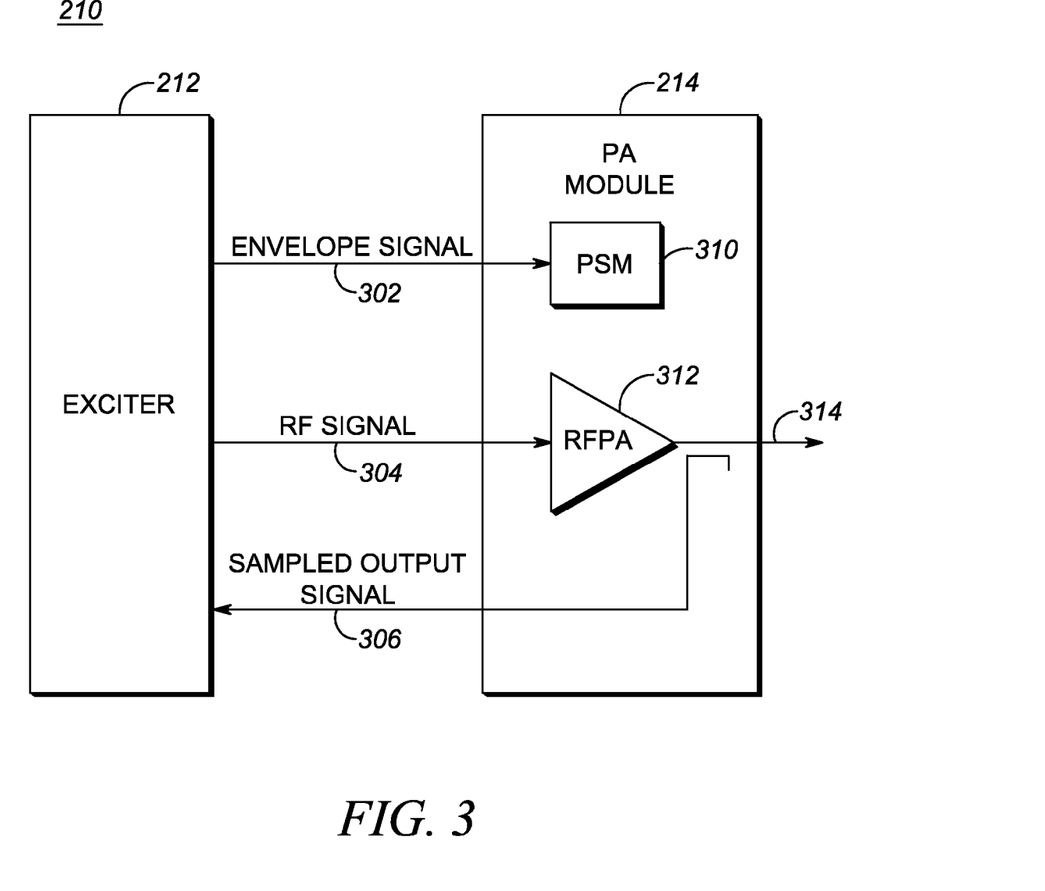
FIG. 3 is a block diagram of a transmitter of the communication device of FIG. 2 in accordance with an embodiment of the present invention.

Referring now to FIGS. 2 and 3, transmitter 210 includes at least one exciter module 212 (one shown) coupled to a power amplifier (PA) module 214. Exciter module 212 supplies low power RF signals 304 to a radio frequency power amplifier (RFPA) 312 of PA module 214. The low power RF signals then are power amplified by RFPA 312, based on an envelope signal 302 (which envelope signal can be single ended or differential) supplied by the exciter module to power supply modulation circuitry (PSM) 310 of the PA module, to produce an output signal 314 for transmission over the air. PA module 214 further feeds back, to exciter module 212, a sample 306 of output signal 314 of RFPA 312. The fed back signal is used by exciter module 214 to correct for amplitude and delay variation and delay offset in output signal 314.

Typically, exciter module 212 is signal modulation scheme dependent. That is, an RF transmitter, such as transmitter 210, may utilize a different exciter module 212 for each signal modulation scheme, such as Integrated Digital Enhanced Network (iDEN), Terrestrial Trunked Radio (TETRA), Frequency Division Multiple Access (FDMA), Global System for Mobile communications (GSM), Code Division Multiple Access (CDMA), CDMA2000, 3GPP (Third Generation Partnership Project) LTE (Long Term Evolution), 3GPP2 (Third Generation Partnership Project 2) Evolution, such as 3GPP2 EVDO (Enhanced Voice-Data Optimized), Worldwide Interoperability for Microwave Access (WiMAX) (the IEEE (Institute of Electrical and Electronics Engineers) 802.16 standards), Wireless Local Area Network (WLAN) as described by the IEEE 802.xx standards, for example, the 802.11a/HiperLAN2, 802.11g, or 802.20 standards, or any of multiple proposed ultrawideband (UWB) standards. In such embodiments, the exciter modules may be swapped in and out of transmitter 210 depending upon the modulation scheme used by the particular system in which the transmitter is being deployed. In other such embodiments, transmitter 210 may include multiple exciter modules and the transmitter may couple, via one or more switches (not shown), a particular exciter module of the multiple exciter modules to PA module 214 depending upon the signal modulation scheme desired to be used to transmit a particular signal. In still other such embodiments, exciter module 212 may store multiple sets of Digital Signal Processor (DSP) code to be executed by one or more DSPs, wherein each set of DSP code implements a different signal modulation scheme of multiple signal modulation schemes that may be employed by the exciter module. In such an embodiment, sets of DSP code may be switched in and out of operation, thereby permitting multiple signal modulation schemes to be implemented without having to swap out, or switch out, an exciter module.

Thus, exciter module 212 and PA module 214 are able to operate essentially independent of each other. That is to say, independent of which exciter module 212 is coupled to PA Module 214, the PA module is able to linearly amplify the RF signal 304 provided to it by the exciter module. In the prior art, every time a new signal modulation is employed for modulation of a transmitter output signal, such output signal 314, for example, every time an exciter module is switched in and out of a transmitter, such as transmitter 210, or every time the transmitter powers up, the transmitter would have to retrain its exciter and PA modules, that is, run a new calibration and training cycle. By contrast, transmitter 210 does not require training and may immediately amplify an RF signal upon a switch of modulation schemes or upon being powered up.

Figure 4:
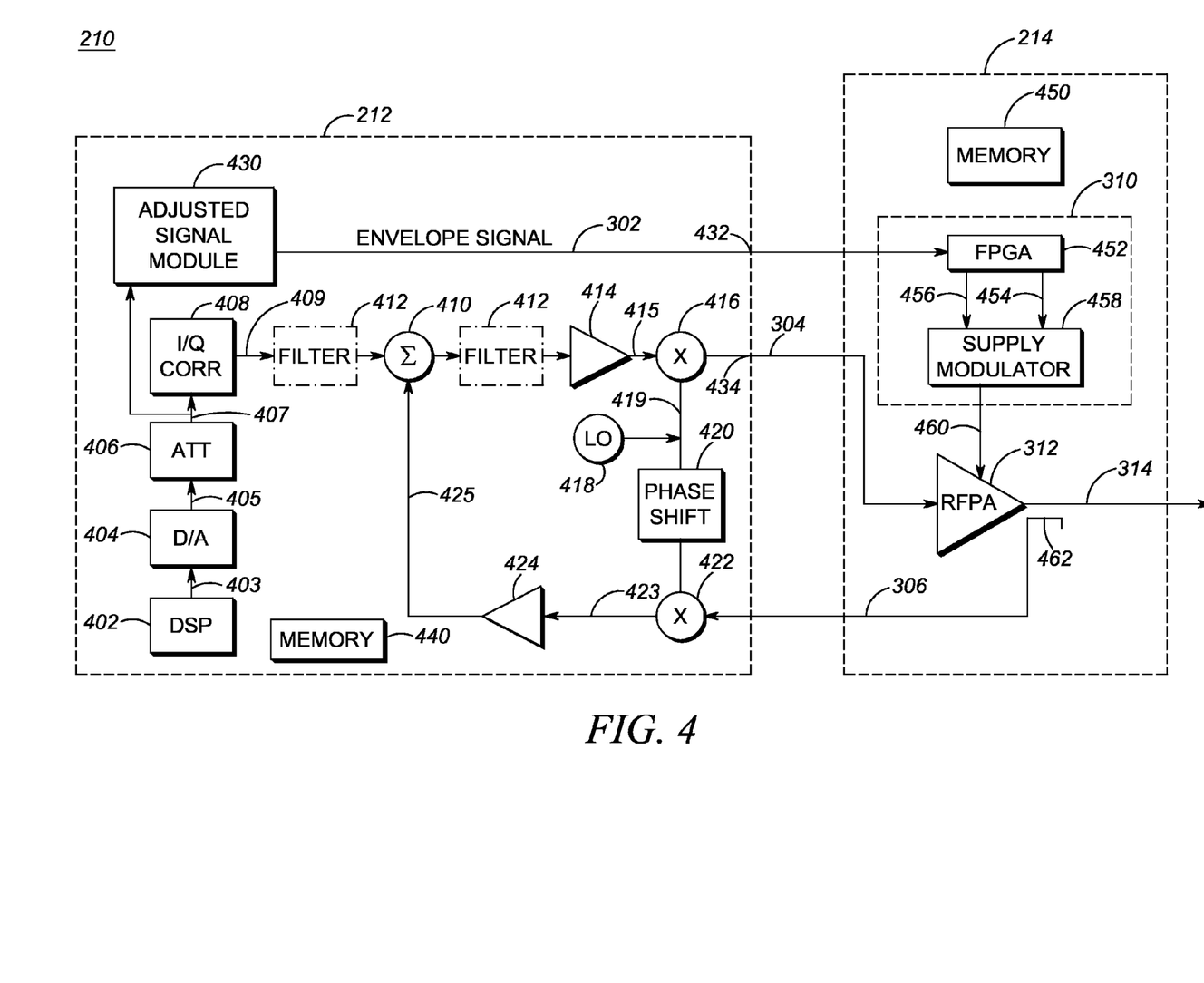
FIG. 4 is a block diagram of a transmitter of the communication device of FIG. 2 in accordance with an embodiment of the present invention.

Referring now to FIG. 4, a block diagram of transmitter 210, and in particular exciter module 212 and PA module 214, is provided depicting the exciter module and PA module in greater detail. Transmitter 210 employs a linear modulation technique and, as noted above, can be used in any of multiple signal modulation schemes that may utilize linear modulation, such as Integrated Digital Enhanced Network (iDEN), Terrestrial Trunked Radio (TETRA), and Transducer Electronic Data Sheet (TEDS) platforms. In each of the embodiments described herein, an input RF signal is assumed to be a modulated signal. However, the input signal may also comprise of a multi-carrier signal or a slotted signal. The slotted signal can comprise at least one off slot or a lower power slot in addition to the slots carrying modulated data.

Exciter module 212 includes a digital signal processor (DSP) or other microprocessor 402, which may be the same or different from processor 202. Exciter module 212 further includes an at least one memory device 440 that stores data and instructions that, when executed by DSP 402, allows the DSP to perform the functions indicated herein as being performed by the exciter module. At least one memory device 440 may be an IC memory chip containing any form of random access memory (RAM) and/or read only memory (ROM), a floppy disk, a compact disk (CD) ROM, a hard disk drive, a digital video disk (DVD), a flash memory card, a non-volatile memory, or any other medium for storing digital information. One of ordinary skill in the art will recognize that when the DSP has one or more of its functions performed by a state machine or logic circuitry, at least one memory device 440 containing the corresponding operational instructions may be embedded within the state machine or logic circuitry.

At least one memory device 440 includes a program for implementing power supply modulation. Based on an information signal received from information source 206, DSP 402 provides a digital input signal 403 to be transmitted, which digital input signal is pre-modulated pursuant to a determined signal modulation scheme, such as iDEN, TETRA, 3GPP LTE, 3GPP EVDO, and so on, and is converted to an analog input signal 405 by a digital-to-analog (D/A) converter 404. Input signal 403 may comprise an in-phase (I) and quadrature-phase (Q) baseband component as known in the art. Further, although FIG. 4 depicts a transmitter configuration using Cartesian feedback, other implementations such as polar feedback, pre-distortion, or feed-forward implementations may be used.

Analog input signal 405 is routed to attenuator 406. Attenuator 406 applies an attenuation factor, for example, a 'K factor' between 0 and 1, to the analog input signal 405 to provide a level of attenuation appropriate for a signal modulation scheme being employed by the transmitter and for a desired output power level of signal 314 output by transmitter 210. Each of the attenuation factors is maintained in at least one memory device 440 of exciter module 212 in association with a corresponding signal modulation scheme and a desired output power level, and may be pre-programmed into the exciter module or may be stored in the exciter module during a factory calibration. For example, at least one memory device 440 of exciter module 212 may maintain the attenuation factors in an attenuation factor look-up table, wherein each attenuation factor in the table is stored in association with a corresponding signal modulation scheme and a corresponding desired output power level. By way of another example, at least one memory device 440 of exciter module 212 may maintain a transfer function that determines an attenuation factor based on a signal modulation scheme and desired output power level. Based on the signal modulation scheme and the desired output power level being employed by transmitter 210 at any given time, attenuator 406 retrieves a stored attenuation factor from at least one memory device 440 and applies the retrieved attenuation factor to an analog input signal 405.

For example, suppose transmitter 210 is designed to be a 100 Watt (W) transmitter. Further, suppose that transmitter 210 currently is being operated as a 100 W transmitter (that is, to transmit a 100 W signal). In such an instance, attenuator 406 may apply an attenuation factor of '1' to the analog input signal received from DSP 402 to produce an attenuated input signal 407. By way of another example, suppose transmitter 210 is designed to be a 100 W transmitter but currently is being operated as a 50 W transmitter. In such an instance, attenuator 406 may apply a lesser attenuation factor, such as '0.5,' to the analog input signal 405 received from DSP 402 to produce attenuated input signal 407. Similarly, other attenuation factors may be determined and stored by exciter module 212 for other output power levels of transmitter 210 based on a design of transmitter 210. Again, such attenuation factors may be maintained by the exciter module in a look-up table in at least one memory device 440, wherein each attenuation factor in the table is stored in association with a corresponding signal modulation scheme and an output power level, or at least one memory device 440 may maintain a transfer function that determines such attenuation factors based on a signal modulation scheme and an output power level.

A first version of attenuated input signal 407 then is routed to I/Q correction circuit 408 for production of low power RF signal 304. I/Q correction circuit 408 provides further, finer, attenuation to the analog input signal received from DSP 402 and attenuated by attenuator 406 to better assure that the power level of output signal 314 is at the transmitter's desired output power level. A second version of attenuated input signal 407 is routed to adjusted signal module 430 for production of envelope signal 302.

Analog input signal 405, after attenuation by attenuator 406 and I/Q correction circuit 408 to produce attenuated input signal 409, then is supplied to a summer 410. Summer 410 sums attenuated input signal 409 with a baseband signal 425 from a feedback loop to produce a summed signal. Attenuated input signal 409 further may be filtered by one or more variable low pass or band pass filters 412, for example, switch capacitor filters, to minimize any out-of-band emissions in output signal 314. The one or more variable filters 412 may reside between I/Q correction circuit 408 and summer 410, in which event the filter filters the signal output by the I/Q correction circuit 408, and/or may reside between summer 410 and an amplifier 414, in which event the filter filters the summed signal output by the summer A bandwidth of each of the one or more variable filters 412 depends upon the signal modulation schemes being employed by transmitter 210, as different signal modulation schemes utilize signals of different bandwidths. Accordingly, the bandwidth of the one or more filters 412 is adjusted based on the signal modulation scheme.

The summed signal output by summer 410 is amplified by amplifier 414 to produce an amplified signal 415 that is routed to a modulator 416. Modulator 416 further receives a carrier signal 419 from a local oscillator 418 and upconverts amplified signal 415 to a transmission frequency based on the carrier signal, producing a low power radio frequency (RF) signal 304 according to a signal modulation scheme. The summed signal may be upconverted directly, as shown, or through an intermediate frequency. As only one signal is shown, a 90° phase shifter used to provide signals to modulate the Q component of input signal 403 is not shown. Low power RF signal 304 produced by modulator 416 then is provided to RFPA 312 in PA module 214 via RF signal output port 434 of exciter module 212. Other amplification and/or attenuation stages in the exciter module 212 and/or PA module 214 have been omitted in FIG. 4 for clarity. RFPA 312 of PA module 214 provides power amplification of low power RF signal 304 to produce an RF output signal 314 for transmission over the air.

A coupler 462 couples RF output signal 314 from RFPA 312 to produce a coupled output signal 306 that is fed back to exciter module 212. Exciter module 212 routes coupled output signal 306 to a demodulator 422, where the coupled output signal is demodulated from the transmission frequency to baseband based on the carrier signal 419 generated by local oscillator 418, to produce a baseband signal 423. The coupled output signal may be amplified and/or attenuated prior to being demodulated. Also, one or more phase shifters 420 may provide a predetermined phase shift to the carrier signal provided by local oscillator 418 to demodulator 422. This phase shift is used to compensate the I and Q signals for the individual path delays in the Cartesian feedback loop as well as the overall loop delay. Baseband signal 423 then is amplified by a feedback amplifier 424 before being supplied to summer 410, where the amplified baseband signal 425 is used to improve the linearity of the signal to be transmitted by transmitter 210, that is, output signal 314, as known in the art.

In response to receiving low power RF signal 304 from exciter module 212, RFPA 312 of PA module 214 amplifies the low power RF signal based on a power supply voltage 460 sourced to the RFPA by PSM 310 of PA module 214. The amplification of low power RF signal 304 by the RFPA produces an RF output signal 314 for transmission by transmitter 210.

PSM 310 generates power supply voltage 460 based on an envelope of input signal 403 sourced by DSP 402. PSM 310 includes a processor such as a floating-point gate array (FPGA), DSP, or complex programmable logic device (CPLD) 452 (hereinafter referred to as an FPGA for convenience) and a power supply modulator 458.

DSP 402, in exciter module 212, supplies envelope information 302 to FPGA 452 via D/A 404, attenuator 406, and an adjusted signal module 430, bypassing I/Q correction circuit 408 (that is, the fine tuning provided by I/Q correction circuit 408). Power supply modulator 458, which may be a fast acting DC-to-DC converter, modulates the power supply voltage 460 of RFPA 312 such that the modulated power supply voltage corresponds to the desired power supply voltage determined using the envelope of input signal 403. Such converters are known in the art, and provide an output signal 460 corresponding to a reference signal, which as shown in FIG. 4 is the analog envelope signal 302 (again noting that this signal can be single ended or differential) output by signal adjuster 430.

To control the power supply voltage, FPGA 452 receives envelope signal 302 from attenuator 406 of exciter module 212 via adjusted signal module 430 and envelope signal output port 432 of the exciter module. Adjusted signal module 430 comprises multiple adjustable amplifiers, and uses an adjusted signal module transfer function, stored in at least one memory device 440 of exciter module 212, to normalize a gain of attenuated input signal 407. Based on the attenuation factor applied by attenuator 406, the adjusted signal module transfer function determines a gain to apply to an attenuated input signal received by the adjusted signal module 430, such that an amplitude-controlled envelope signal 302 is applied to PA module 214, where the amplitude-controlled envelope signal 302 is routed to FPGA 452.

That is, it is desired that a normalized amplitude envelope signal 302 be applied to FPGA 452 regardless of the exciter module 212 signal modulation scheme being employed by transmitter 210. By a normalized amplitude, it is meant that the envelope signals applied to FPGA 452 have a same maximum, or peak, amplitude regardless of the exciter module 212 being used and regardless of the attenuation factor applied by attenuator 406. Therefore, adjusted signal module 430 adjusts a gain of attenuated input signal 407 in compensation for the attenuation applied by attenuator 406 and to set the gain of envelope signal 302 at a predetermined level for provision to PA module 214. For example, adjusted signal module 430 may apply a gain that is approximately the inverse of the attenuation applied by attenuator 406; however, the predetermined level may be any level deemed appropriate by a designer of transmitter 210.

FPGA 452, with reference to an at least one memory device 450 of PA module 214, for example, a non-volatile memory (NVM), then applies a delay to envelope signal 302 received from signal adjuster 430 to produce a delayed envelope signal 454. The delay is based on a stored exciter module delay factor maintained in at least one memory device 440 of the exciter module 212, which exciter module delay factor corresponds to a time difference, or delay, between a propagation time of a signal through an envelope signal path of the exciter and a signal propagation time of a signal through an RF signal path, also referred to herein as an I/Q path, of the exciter module. The delay further is based on a PSM delay factor maintained in at least one memory device 450 of PA module 214, which PSM delay factor corresponds to a difference in time between when envelope signal 302 is applied to FPGA 452 and when power supply modulator 458 outputs a corresponding supply voltage 460 to RFPA 312 or when the RFPA outputs a corresponding output signal 314, since RF delay is minimal.

FPGA 452 provides delayed envelope signal 454 to power supply modulator 458. Based on delayed envelope signal 454, power supply modulator 458 generates a power supply voltage 460 that is supplied to a supply input of RFPA 312. FPGA 452 further may use multiple control signals 456 to control power supply modulator 458 to limit the power supply voltage and prevent it from overdriving RFPA 312. RFPA 312 then amplifies low power RF signal 304 based on power supply voltage 460 to produce an RF output signal 314 for transmission by transmitter 210.

Exciter module delay factors are determined for each exciter module 212 during a factory or field-based calibration of the exciter module. The exciter module is calibrated for each possible signal modulation scheme (or bandwidth setting of the one or more filters 412) that may be employed by the transmitter when using that exciter module. As noted above, an exciter module delay factor corresponds to a time difference, or delay, between a propagation time of a signal through the envelope signal path of the exciter module (that is, through D/A 404, attenuator 406, and adjusted signal module 430) and a propagation time of a signal through the RF signal path, or I/Q path, of the exciter module (that is, through D/A 404, attenuator 406, I/Q correction circuit 408, filter 412, modulator 410, amplifier 414, and modulator 416). While the propagation time of a (baseband) signal through the envelope signal path is likely to vary little regardless of the signal modulation scheme employed, the propagation time of a signal through the RF path may vary more significantly with the signal modulation scheme due to variations in path impedances for RF signals of different frequencies and due to differences in the one or more filters 412 that may be employed in association with a particular signal modulation scheme. The exciter module delay factors then are stored in at least one memory device 440 of exciter module 212.

Adjusted signal module gain factors also are determined for each exciter module 212 during the factory or field-based calibration and stored in at least one memory device 440 of exciter module 212. That is, an adjusted signal module gain factor is determined for each possible output power level of the transmitter using that exciter module. More particularly, for each possible signal modulation scheme for which the exciter module may be used and for each possible output power level of the transmitter when using that exciter module, attenuator 406 applies an individualized attenuation factor to the input signal received from D/A 402. During the calibration routine, for each possible signal modulation scheme and for each possible output power level, an adjusted signal module gain factor is determined for application, by adjusted signal module 430, to attenuated input signals 407 received from attenuator 406, such that an amplitude of envelope signal 302, sourced by the exciter module to PA module 310 and in particular to FPGA 452, is normalized. The determined gain factors may be stored by the exciter module in a gain factor look-up table in at least one memory device 440, wherein each gain factor in the table is stored in association with a corresponding signal modulation scheme and an associated output power level, or at least one memory device 440 may maintain a transfer function that determines such gain factors based on a signal modulation scheme and an output power level.

One or more PSM delay factors are determined during a factory or field-based calibration of PA module 214 and stored in at least one memory device 450 of the PA module. (For ease of reference, only one PSM delay factor is referenced herein but the PA module could have multiple PSM delay factors, similar to exciter module 212, and each such PSM delay factor may be calibrated during the factory or field-based calibration of the PA module as described below with respect to FIG. 6.) As noted above, the PSM delay factor corresponds to a difference in time between when envelope signal 302 is applied to FPGA 452 and when power supply modulator 458 outputs a corresponding supply voltage 460 to RFPA 312. FPGA 452 then uses the stored PSM delay factor, in association with an exciter module delay factor received from an exciter module coupled to the PA module, to match a timing of power supply voltage 460, supplied by power supply modulator 458 to RPFA 312, with a timing of low power RF signal 304 supplied to the RFPA by modulator 416.

The factory or field-based calibration of PA module 214 also calibrates the PA module for amplitude. That is, based on an input of a normalized envelope signal 302 to the PA module, and in particular to FPGA 452 of PSM 310, the PA module is calibrated over a power or supply voltage provided to the RFPA 312 and a resulting power of output signal 314. A PA module transfer function then is stored in at least one memory device 450 of the PA module that is representative of a relationship between the power or supply voltage provided to the RFPA and the resultant power of output signal 314. In other embodiments of the present invention, the relationship could be stored in the form of a look up table.

Figure 5A:
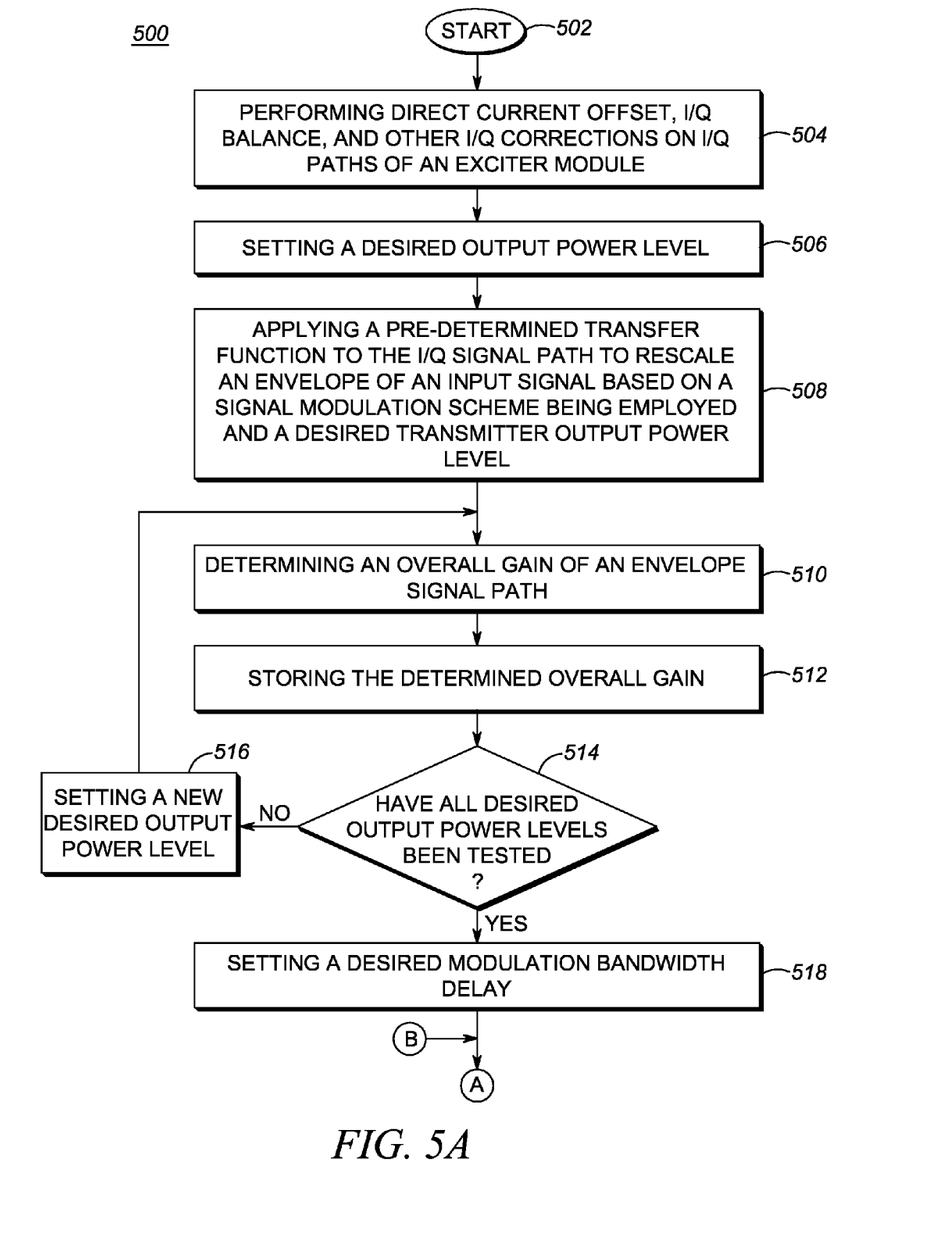
FIG. 5A is a logic flow diagram illustrating an exemplary calibration of an exciter module of the transmitter of FIG. 2 for a given signal modulation scheme in accordance with an embodiment of the present invention.
Figure 5B:
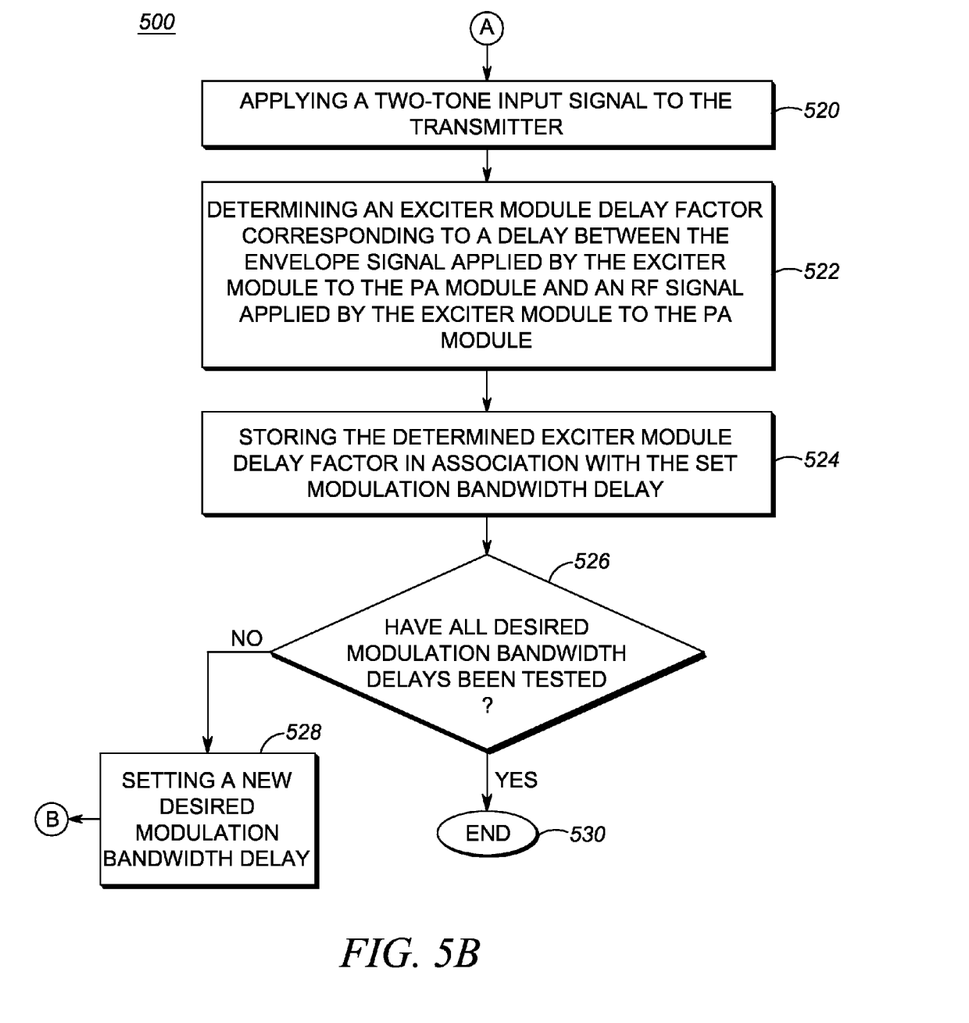
FIG. 5B is a continuation of the logic flow diagram of FIG. 5A illustrating an exemplary calibration of an exciter module of the transmitter of FIG. 2 for a given signal modulation scheme in accordance with an embodiment of the present invention.

Referring now to FIGS. 5A and 5B, a logic flow diagram 500 is depicted that illustrates an exemplary calibration of exciter module 212 for a given signal modulation scheme in accordance with an embodiment of the present invention. Logic flow diagram 500 begins (502) when DSP 402 performs (504) Direct Current (DC) offset, I/Q balance, and other I/Q corrections associated with the RF, or I/Q, path (that is, D/A 404, attenuator 406, I/Q correction circuit 408, one or more filters 412, modulator 410, amplifier 414, and modulator 416) through the exciter module in accordance with known techniques. The DC offset, I/Q balance, and other I/Q corrections correspond to adjustments made in the signal output by the DSP so that an accurate RF representation of the digital signal output by the DSP is supplied to RFPA 312. A desired output power level, that is, a desired power level for a transmitter output signal, such as output signal 314, also is set (506).

DSP 402 then outputs a corrected input signal to D/A 404. Preferably, this input signal is a two-tone signal, as the purpose is to use a constant/repeatable signal and then use a pre-determined transfer function to rescale to the actual input signal modulation. D/A 404 converts the input signal to an analog input signal 405 and routes the analog input signal to attenuator 406. Attenuator 406 applies (508) a pre-determined transfer function, including application of a gain, or 'K,' factor, to the signal received from the D/A to rescale an envelope of the input signal based on the signal modulation scheme being employed and a desired transmitter output power level, which pre-determined transfer function is stored in association with the signal modulation scheme in memory device 440. Attenuator 406 then routes rescaled signal 407 to envelope signal output port 432 via variable gain adjuster 430. Variable gain adjuster 430 adjusts the gain of the envelope signal, and an overall gain of the envelope signal path is determined (510) and stored (512) in memory device 440 in association with the signal modulation scheme and the desired output power level. Steps 508-510 then are repeated (514) for each additional output power level, and corresponding gain, or 'K,' factor, desired to be tested by setting (516) a new output power level and then returning to step 508.

After a gain of the envelope signal path is determined (514) for all output power levels, and corresponding gain, or 'K,' factors, desired to be tested, a desired modulation bandwidth delay/signal modulation scheme is set (518) for the exciter module. That is, the RF signal path of the exciter module is set-up for a particular signal modulation scheme, which setting up includes selecting appropriate filters 412 for that signal modulation scheme. A two-tone input signal is input (520) into exciter module 212 via DSP 402. The two-tone input signal is routed to each of envelope signal output port 432 via the envelope signal path, that is, D/A 404, attenuator 406, and adjusted signal module 430, and to RF signal output port 434 via the RF signal path, that is, D/A 404, attenuator 406, I/Q correction circuit 408, one or more filters 412, modulator 410, amplifier 414, and modulator 416. Preferably, the two-tone signal spacing is representative of the bandwidth (BW) of the modulation. Again, a two-tone signal is used for a nice clear repeatable signal to determine the delay. An exciter module delay factor then is determined (522) that corresponds to a difference between a time that it takes the two-tone signal to propagate through the envelope signal path to envelope signal output port 432 and a time that it takes the two-tone signal to propagate through the RF signal path to RF signal output port 434. The exciter module delay factor is stored (524) in at least one memory device 440 in association with the signal modulation scheme. Steps 520-524 then are repeated (526) for each additional modulation bandwidth delay/signal modulation scheme desired to be tested by setting up (528) a new RF signal path (including, again, selecting appropriate filters 412) for exciter module and then returning to step 520. After an exciter module delay factor is determined (526) for all modulation bandwidth delay/signal modulation scheme desired to be tested, logic flow 500 then ends (530).

Figure 6:
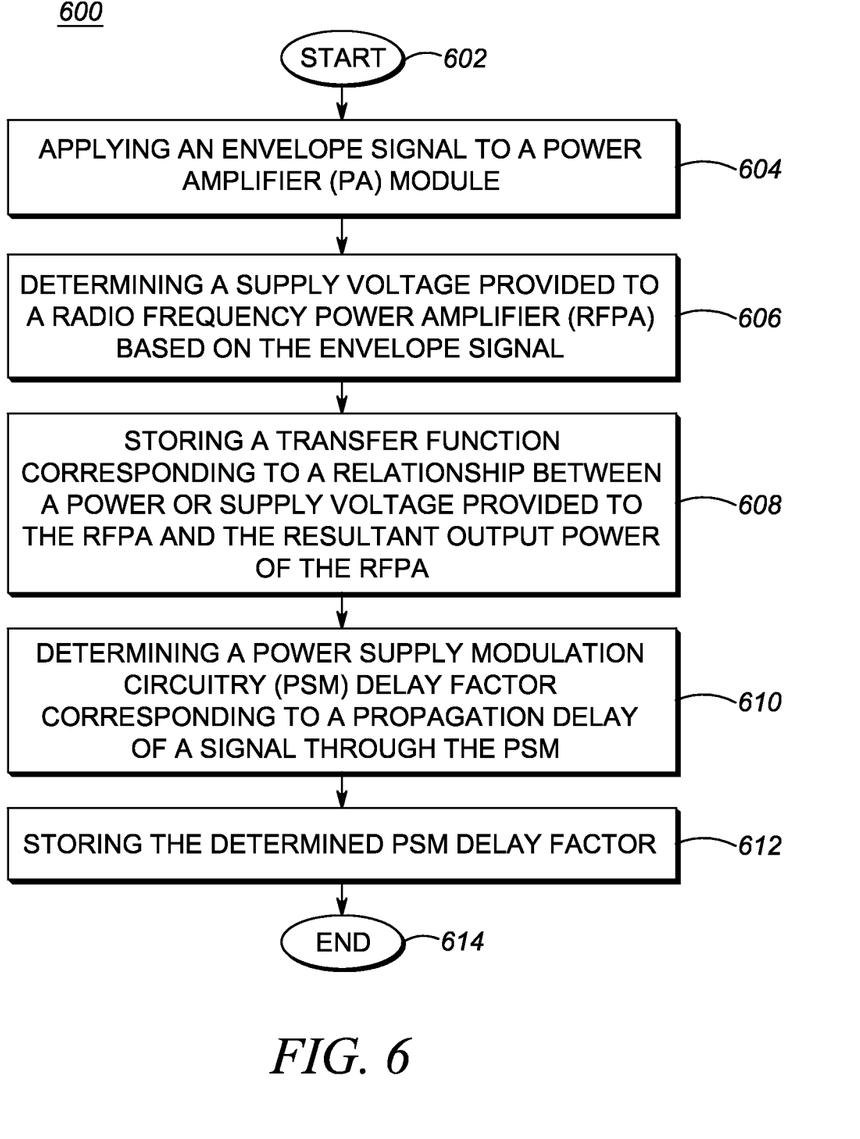
FIG. 6 is a logic flow diagram illustrating an exemplary calibration of a power amplifier module of the transmitter of FIG. 2 in accordance with an embodiment of the present invention.

Referring now to FIG. 6, a logic flow diagram 600 is depicted that illustrates a calibration of PA module 214 in accordance with an embodiment of the present invention. Logic flow diagram 600 begins (602) when an envelope signal of a predetermined voltage is applied (604) to PSM 310, and in particular to FPGA 452. In response to applying the envelope signal, a corresponding supply voltage output by PSM 310, and particular by power supply modulator 458, is determined (606). A PA module transfer function, representative of a relationship between a power or supply voltage provided to RFPA 312 and a resultant power of the output signal 314 produced by the RFPA, is determined and stored (608) in at least one memory device 450. Further, a PSM delay factor corresponding to a time that it takes the envelope signal to propagate through PSM 310, that is, through FPGA 452 and power supply modulator 458, is determined (610) and stored (612) in at least one memory device 450, and logic flow diagram 600 then ends (614), Referring now to FIGS. 7A and 7B, a logic flow diagram 700 is depicted that illustrates an exemplary operation of transmitter 210 in accordance with an embodiment of the present invention. Logic flow diagram 700 begins (702) when exciter module 212 determines (704) a signal modulation scheme to be used to transmit an input signal 403. Exciter module 212, and in particular attenuator 406, further determines (706) an attenuation factor, that is, a K factor, appropriate for the determined signal modulation scheme and for a desired output power level. Further, exciter module 212, and in particular adjusted signal module, normalizes (708) the attenuation factor to produce a normalized attenuation factor.

Figure 7A:
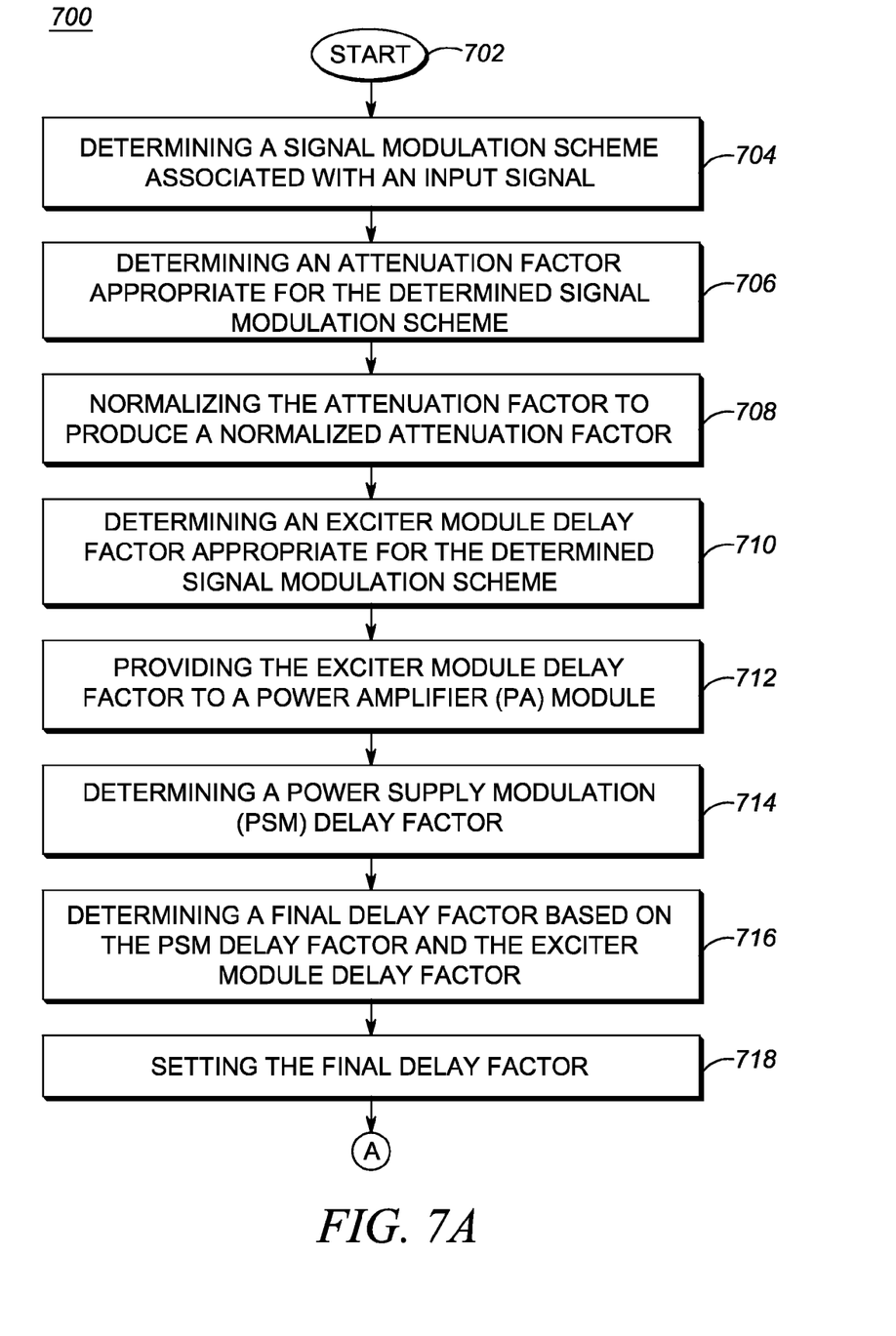
FIG. 7A is a logic flow diagram illustrating an exemplary operation of the transmitter of FIG. 2 in accordance with an embodiment of the present invention.
Figure 7B:
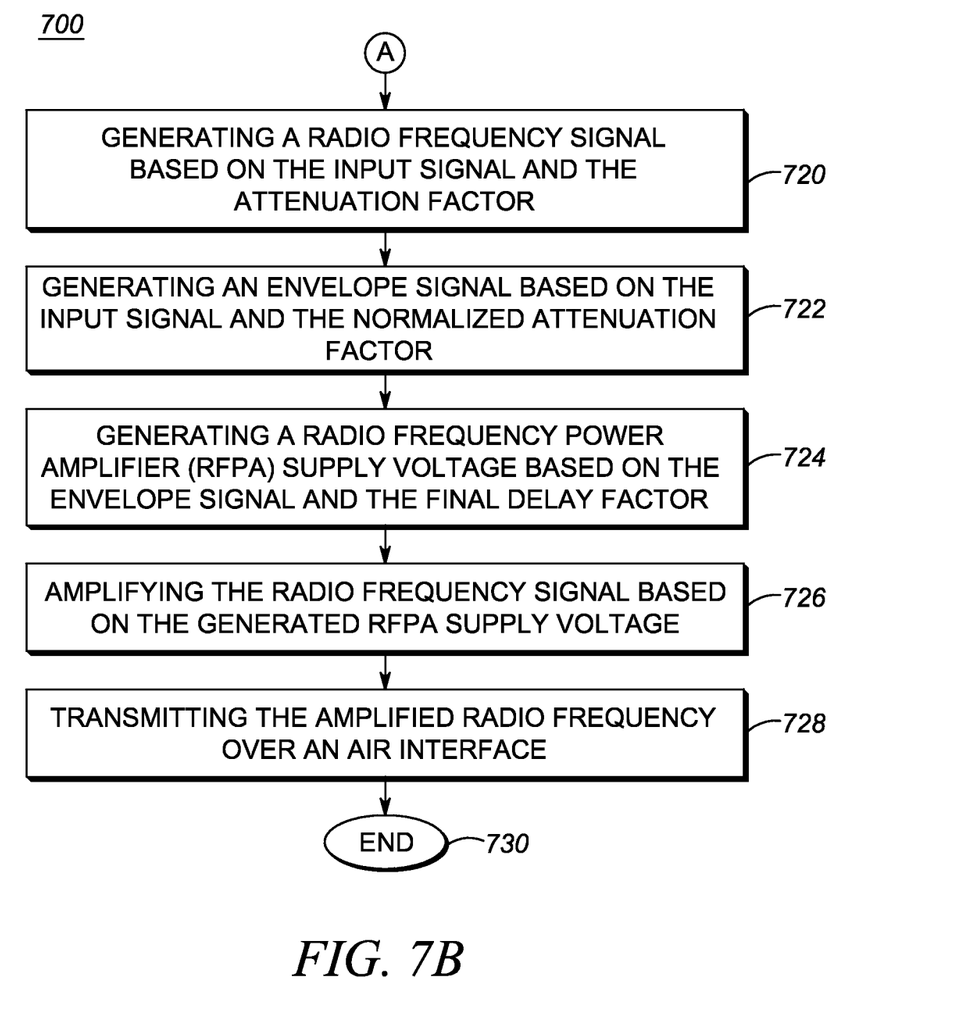
FIG. 7B is a continuation of the logic flow diagram of FIG. 7A illustrating an exemplary operation of the transmitter of FIG. 2 in accordance with an embodiment of the present invention.

Based on the determined signal modulation scheme, exciter module 212 determines (710), by retrieving from at least one memory device 440, an exciter module delay factor that, as noted above, corresponds to a propagation time difference between the envelope signal path and the RF signal path of the exciter module. Exciter module 212 then provides (712) the exciter module delay factor to PA module 214, and in particular to PSM 310. In addition to receiving the exciter module delay factor from exciter module 212, PA module 214, and in particular PSM 310, determines (714), by retrieving from at least one memory device 450, a PSM delay factor that corresponds to a time delay between the application of an envelope signal 302 to PA module 214, and in particular to PSM 310, and the generation, by the PSM, of a power supply voltage 460 based on the envelope signal 302. Based on the exciter module delay factor and the PSM delay factor, PA module 214, and in particular PSM 310, determines (716), and sets (718), a final delay factor for application to the envelope signal 454 provided by FPGA 452 to power supply modulator 458.

The final delay factor time aligns the input of a supply voltage 460 into RFPA 312 with the amplification of a corresponding low power RF signal 304 by the RFPA, which supply voltage and low power RF signal are based on a same instance of input signal 403. That is, the exciter module delay factor corresponds to a time difference between when envelope signal 302, based on an input signal 403, arrives at envelope signal output port 432, and correspondingly is input to PSM 310, and a later time at which a low power RF signal 304, based on the same instance of input signal 403, arrives at RF signal output port 434. The PSM delay factor then corresponds to a time expiring between the input of envelope signal 302 into PSM 310 and the output of power supply voltage 460 from the PSM. Accordingly, the final delay factor corresponds to a timing delay that must be added to the generation of a power supply voltage by PSM 310, based on input signal 403, so that the application of the power supply voltage to RFPA 312 aligns with the arrival, at the RPFA, of a low power RF signal based on the same instance of input signal 403. From another perspective, an exemplary algorithm that may be employed in determining the final delay factor may be 'Final Delay Factor=Exciter Module Delay Factor–PSM Delay Factor.' The final delay factor is determined before transmitter 201 actually begins to transmit, so there is no delay in transmission.

Exciter module 212 generates (720) a low power RF signal 304 based on input signal 403 and the attenuation factor, as described above. Exciter module 212 further generates (722) an envelope signal 302 based on input signal 403 and the normalized attenuation factor, as described above. Exciter module 212 then conveys the low power RF signal and the envelope signal to PA module 214. PA module 214 routes the received envelope signal 302 to PSM 310, and PSM 310 generates (724) a power supply voltage 460 based on the envelope signal and the final delay factor. PA module 214 routes the received low power RF signal 304 and the generated power supply voltage to RFPA 312, and the RFPA amplifies (726) the low power RF signal based on the power supply voltage to produce transmitter output signal 314. Transmitter 210 then wirelessly transmits (728) output signal 314, for example, over the downlink of air interface 106, and logic flow diagram 700 then ends (730).

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about," or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure.

This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A method for modulating a radio frequency signal, the method comprising:
    determining an exciter module delay factor based on a signal modulation scheme, wherein the exciter module delay factor corresponds to a propagation time difference between an envelope signal path of an exciter module and an RF signal path of the exciter module;
    determining a power supply modulation delay factor, wherein the power supply modulation delay factor corresponds to a time delay between an application of an envelope signal to a power supply modulation circuit and a generation of a power supply voltage based on the envelope signal;
    determining a final delay factor based on the exciter module delay factor and the power supply modulation delay factor;
    generating a radio frequency signal based on an input signal;
    generating an envelope signal based on the input signal;
    generating a power supply voltage based on the envelope signal and the final delay factor; and
    modulating the radio frequency signal based on the power supply voltage.

2. The method of claim 1, further comprising determining an attenuation factor based on the signal modulation scheme and wherein generating a radio frequency signal comprises generating the radio frequency signal based on the input signal and the attenuation factor.

3. The method of claim 2, wherein determining an attenuation factor comprises one of:
    looking up the attenuation factor in an attenuation factor look-up table based on a corresponding signal modulation scheme and desired output power level; and
    determining the attenuation factor by reference to a transfer function and based on a signal modulation scheme and desired output power level.

4. The method of claim 2, further comprising normalizing the attenuation factor to produce a normalized attenuation factor and wherein generating an envelope signal comprises generating the envelope signal based on the input signal and the normalized attenuation factor.

5. The method of claim 4, wherein normalizing the attenuation factor comprises determining a gain factor for rescaling a signal attenuated by the attenuation factor.

6. The method of claim 1, wherein determining an exciter module delay factor comprises retrieving a stored exciter module delay factor and wherein determining a power supply modulation delay factor comprises retrieving a stored power supply modulation delay factor.

7. The method of claim 6, wherein the method further comprises:
    separately calibrating each of an exciter module and a power amplifier module, wherein the exciter module delay factor is determined during calibration of the exciter module and stored in the exciter module and wherein the power supply modulation delay factor is determined during calibration of the power amplifier module and stored in the power amplifier module.

8. The method of claim 7, wherein calibrating the exciter module comprises determining a plurality of exciter module delay factors for a plurality of signal modulation schemes.

9. The method of claim 7, wherein calibrating the power amplifier module comprises determining a relationship between one or more power supply voltages used to modulate a radio frequency signal and resultant powers of the modulated radio frequency signal.

10. A power supply modulation transmitter comprising:
    an exciter module that is configured to determine an exciter module delay factor based on a signal modulation scheme, wherein the exciter module delay factor corresponds to a propagation time difference between an envelope signal path of the exciter module and an RF signal path of the exciter module; and
    a power amplifier module that is coupled to the exciter module and that is configured to determine a power supply modulation delay factor, wherein the power supply modulation delay factor corresponds to a time delay between an application of an envelope signal to the power amplifier module and a generation of a power supply voltage based on the envelope signal, and determine a final delay factor based on the exciter module delay factor and the power supply modulation delay factor;
    wherein the exciter module further is configured to generate a radio frequency signal based on an input signal and generate an envelope signal based on the input signal; and
    wherein the power amplifier module further is configured to receive the radio frequency signal and the envelope signal from the exciter module, generate a power supply voltage based on the envelope signal and the final delay factor, and modulate the radio frequency signal based on the power supply voltage.

11. The transmitter of claim 10, wherein the exciter module further is configured to determine an attenuation factor based on the signal modulation scheme and wherein the exciter module is configured to generate a radio frequency signal by generating the radio frequency signal based on the input signal and the attenuation factor.

12. The transmitter of claim 11, wherein the exciter module is configured to determine an attenuation factor by one of:
    looking up the attenuation factor in an attenuation factor look-up table based on a corresponding signal modulation scheme and desired output power level; and
    determining the attenuation factor by reference to a transfer function and based on a signal modulation scheme and desired output power level.

13. The transmitter of claim 11, wherein the exciter module further is configured to normalize the attenuation factor to produce a normalized attenuation factor and wherein the exciter module is configured to generate an envelope signal by generating the envelope signal based on the input signal and the normalized attenuation factor.

14. The transmitter of claim 13, wherein the exciter module further is configured to normalize the attenuation factor by determining a gain factor for rescaling a signal attenuated by the attenuation factor.

15. The transmitter of claim 10, wherein the exciter module is configured to determine an exciter module delay factor by retrieving a stored exciter module delay factor and wherein determining a power supply modulation delay factor comprises retrieving a stored power supply modulation delay factor.

16. The transmitter of claim 15, wherein the exciter module and the power amplifier module each are separately calibrated, wherein the exciter module delay factor is determined during calibration of the exciter module and stored in the exciter module and wherein the power supply modulation delay factor is determined during calibration of the power amplifier module and stored in the power amplifier module.

17. The transmitter of claim 16, wherein a plurality of exciter module delay factors for a plurality of signal modulation schemes are determined and stored in the exciter module during calibration of the exciter module.

18. The transmitter of claim 16, wherein a relationship between one or more power supply voltages used to modulate a radio frequency signal and resultant powers of the modulated radio frequency signal is determined and stored in the power amplifier module during calibration of the power amplifier module.

19. A wireless communication device comprising:
an information source that sources information to a transmitter; and
a transmitter that is configured to:
receive the information from the information source and produce an input signal based on the received information;
determine an exciter module delay factor based on a signal modulation scheme, wherein the exciter module delay factor corresponds to a propagation time difference between an envelope signal path of an exciter module and an RF signal path of the exciter module;
determine a power supply modulation delay factor, wherein the power supply modulation delay factor corresponds to a time delay between an application of an envelope signal to a power supply modulation circuit and a generation of a power supply voltage based on the envelope signal;
determine a final delay factor based on the exciter module delay factor and the power supply modulation delay factor;
generate a radio frequency signal based on the input signal;
generate an envelope signal based on the input signal;
generate a power supply voltage based on the envelope signal and the final delay factor;
modulate the radio frequency signal based on the power supply voltage to produce an output signal; and
wirelessly transmit the output signal.

20. The wireless communication device of claim 19, wherein the wireless communication device is a base station.

\* \* \* \* \*